US012628618B2

(12) United States Patent
Baek et al.

(10) Patent No.: US 12,628,618 B2
(45) Date of Patent: May 12, 2026

(54) APPARATUS AND METHOD FOR SETTING SEMICONDUCTOR PARAMETER

(71) Applicant: POSTECH Research and Business Development Foundation, Pohang-si (KR)

(72) Inventors: Rock Hyun Baek, Pohang-si (KR); Hyeok Yun, Ulsan (KR)

(73) Assignee: POSTECH RESEARCH AND BUSINESS DEVELOPMENT FOUNDATION, Pohang-si (KR)

( * ) Notice: Subject to any disclaimer, the term of this patent is extended or adjusted under 35 U.S.C. 154(b) by 847 days.

(21) Appl. No.: 17/983,319

(22) Filed: Nov. 8, 2022

(65) Prior Publication Data

US 2023/0274985 A1      Aug. 31, 2023

(30) Foreign Application Priority Data

Feb. 25, 2022    (KR) ........................ 10-2022-0025392

(51) Int. Cl.
 *H10P 74/20*      (2026.01)
 *G06N 3/08*       (2023.01)
 *H10P 74/00*      (2026.01)
(52) U.S. Cl.
 CPC ............. *H10P 74/207* (2026.01); *G06N 3/08* (2013.01); *H10P 74/203* (2026.01); *H10P 74/23* (2026.01)
(58) Field of Classification Search
 CPC ......... H01L 22/14; H01L 22/12; H01L 22/20; G06N 3/08

(Continued)

(56) References Cited

U.S. PATENT DOCUMENTS 6,470,230 B1 * 10/2002 Toprac .................... H01L 22/20
                                                      700/121
9,875,946 B2 * 1/2018 Shchegrov .............. H01L 22/20
(Continued)

FOREIGN PATENT DOCUMENTS

KR    10-2005-0055729 A    6/2005
KR    10-2016-0002968 A    1/2016
(Continued)

OTHER PUBLICATIONS

Yun, Hyeok, et al. "Accurate Prediction and Reliable Parameter Optimization of Neural Network for Semiconductor Process Monitoring and Technology Development." Advanced Intelligent Systems 5.9 (2023): 2300089.
(Continued)

*Primary Examiner* — Suchin Parihar
(74) *Attorney, Agent, or Firm* — Morgan, Lewis & Bockius LLP

(57)      ABSTRACT

Disclosed are a method and apparatus for setting a semiconductor parameter. The method for setting a semiconductor parameter according to an embodiment of the present disclosure is a method performed on a computing apparatus including one or more processors and a memory storing one or more programs executed by the one or more processors, the method including acquiring electrical measurement parameters corresponding to preset semiconductor manufacturing parameters, classifying the electrical measurement parameters into a plurality of groups according to a degree of correlation, extracting a correlation axis reflecting a correlation between electrical measurement parameters belonging to a corresponding group for each classified group, and predicting a figure of merit of a semiconductor device by using data values of electrical measurement (Continued)

parameters belonging to the corresponding group as input based on the correlation axis of each group.

18 Claims, 8 Drawing Sheets

(58) Field of Classification Search
USPC ......................................................... 716/132
See application file for complete search history.

(56) References Cited

U.S. PATENT DOCUMENTS

| | | | | |
|---|---|---|---|---|
| 11,494,636 | B2 * | 11/2022 | Jung ........................ | H01L 22/12 |
| 11,976,984 | B1 * | 5/2024 | Wang ........................ | G01K 7/42 |
| 12,055,904 | B2 * | 8/2024 | Zhang ..................... | G06N 3/045 |
| 2005/0060336 | A1 | 3/2005 | Abercrombie et al. | |
| 2014/0316730 | A1 * | 10/2014 | Shchegrov .............. | H01L 22/12 |
| | | | | 702/81 |
| 2019/0286983 | A1 * | 9/2019 | Jung ........................ | G05B 17/02 |
| 2021/0089694 | A1 * | 3/2021 | Nandakumar ........ | G06F 30/367 |
| 2021/0248293 | A1 | 8/2021 | Yokota et al. | |
| 2022/0011728 | A1 * | 1/2022 | Zhang .................. | G05B 13/027 |
| 2023/0268236 | A1 * | 8/2023 | Dequilettes .......... | G02B 21/248 |
| | | | | 438/5 |

FOREIGN PATENT DOCUMENTS

| | | |
|---|---|---|
| KR | 20190003909 A | 1/2019 |
| KR | 20200125031 A | 11/2020 |

OTHER PUBLICATIONS

Written Decision on Registration in Korean Application No. 10-2022-0025392, dated Jan. 21, 2025, 6 pages including translation.
Office Action for Korean Application No. 10-2022-0025392, dated Apr. 30, 2024, 20 pages including translation.
Scholz et al., "Nonlinear Principal Component Analysis: Neural Network Models and Applications," Principal Manifolds for Data Visualization and Dimension Reduction, Lecture Notes in Computational Science and Engineering, 2008, vol. 58, pp. 44-67, Springer, Berlin, Heidelberg.

* cited by examiner

<u>100</u>

APPARATUS AND METHOD FOR SETTING SEMICONDUCTOR PARAMETER

CROSS-REFERENCE TO RELATED APPLICATION

This application claims the benefit under 35 USC § 119(a) of Korean Patent Application No. 10-2022-0025392, filed on Feb. 25, 2022, in the Korean Intellectual Property Office, the entire disclosure of which is incorporated herein by reference for all purposes.

BACKGROUND

1. Field

Embodiments of the present disclosure relate to a technique for setting a semiconductor parameter.

2. Description of Related Art

In a semiconductor process, it is necessary to develop a semiconductor device with low cost and time and increase the mass production yield due to competition in miniaturization and integration technologies. Techniques using machine learning through an artificial neural network have been proposed as a method for reducing cost and time in a process of developing the semiconductor device.

However, in an actual semiconductor process environment, the measurement of parameters is performed through sampling to reduce the process cost, and thus a missing value occurs. As a result, an inappropriate and incomplete data set with which the artificial neural network is trained is acquired.

In addition, if a process recipe is set and the process is performed based on a specific target value of a semiconductor manufacturing parameter, data generated as a result of the process inevitably includes process variability and random variability that are difficult to control based on the target value. As a result, an input value with which the artificial neural network is trained is one value that is a target value of the semiconductor manufacturing parameter set by the process recipe, but an output value becomes a large number of distributed data including process variability and random variability in the target value. Accordingly, there is a problem that one-to-one data pairs used for general machine learning cannot be acquired.

Here, an electrical measurement parameter (EPM) reflecting information of the process step may be acquired and used as an input value, but the electrical measurement parameters (EPMs) may have a statistical correlation with each other (e.g., in the case of resistance and capacitance, the thicker the metal, the lower the resistance but the larger the capacitance), and the correlation between the electrical measurement parameters (EPMs) is a factor that makes it impossible to perform sensitivity analysis and parameter tuning of the electrical measurement parameter (EPM) alone or independently. In addition, it is very inefficient to perform, by an engineer, the sensitivity analysis and parameter tuning while simultaneously considering the correlation of these electrical measurement parameters in the process of developing the semiconductor device because complex computation is required.

In addition, in order to obtain device characteristic data according to the semiconductor manufacturing parameter, it is necessary to proceed with the semiconductor process while changing the process recipe and obtain the device characteristic data after the process is performed. Accordingly, there is a problem in that a lot of time and money is consumed to proceed with the semiconductor process while variously changing the process recipe.

PRIOR ART LITERATURE

Patent Literature

PTL 1: Korean Unexamined Patent Publication No. 10-2019-0003909 (Jan. 10, 2019)

SUMMARY

Embodiments of the present disclosure are to provide a new technique for setting a semiconductor parameter.

A method for setting a semiconductor parameter according to an embodiment of the present disclosure is a method performed on a computing apparatus including one or more processors and a memory storing one or more programs executed by the one or more processors, the method including acquiring electrical measurement parameters corresponding to preset semiconductor manufacturing parameters, classifying the electrical measurement parameters into a plurality of groups according to a degree of correlation, extracting a correlation axis reflecting a correlation between electrical measurement parameters belonging to a corresponding group for each classified group, and predicting a figure of merit of a semiconductor device by using data values of electrical measurement parameters belonging to the corresponding group as input based on the correlation axis of each group.

The classifying of the electrical measurement parameters into the plurality of groups may include calculating variance inflation factors between the electrical measurement parameters, respectively, and classifying electrical measurement parameters of which the calculated variance inflation factor is equal to or greater than a preset threshold value into the same group.

The extracting of the correlation axis may include generating an artificial neural network model for each group when grouping of the electrical measurement parameters is completed, and extracting a correlation axis between the electrical measurement parameters belonging to each group by training each of the generated artificial neural network models.

The number of the correlation axes to be extracted may be set to be the same as the number of electrical measurement parameters belonging to the corresponding group.

The calculating of the variance inflation factor when a missing value is included in the acquired electrical measurement parameter may include checking whether or not there are data that are not missing at the same time in two electrical measurement parameters, and calculating a variance inflation factor of the two electrical measurement parameters by using the data that are not missing at the same time when there are the data that are not missing at the same time.

When a missing value is included in the acquired electrical measurement parameter, the method may further include training the artificial neural network model by setting a partial loss error to zero for the missing value data when the artificial neural network model is trained, and predicting a missing value of a corresponding electrical measurement parameter by inputting the extracted correlation axis into the artificial neural network model when training of the artificial neural network model is completed.

The method for setting the semiconductor parameter may further include setting an effective correlation axis among the correlation axes extracted for each group, and, in the predicting of the figure of merit of the semiconductor device, the figure of merit of the semiconductor device may be predicted by using data values of electrical measurement parameters belonging to the corresponding group as input based on the effective correlation axis set in each group.

The setting of the effective correlation axis may include calculating explained variances (EVs) for the correlation axes extracted for each group, respectively, and setting, among the correlation axes, a correlation axis in which a value of the calculated explained variance is equal to or greater than a preset threshold value as the effective correlation axis.

The method for setting the semiconductor parameter may further include limiting a data range of the electrical measurement parameters in each classified group within a data distribution range with the extracted correlation axis as a reference.

The method for setting the semiconductor parameter may further include calculating sensitivity to the figure of merit of the electrical measurement parameters within the data distribution range with the correlation axis as a reference, and selecting an electrical measurement parameter capable of optimizing the corresponding figure of merit based on the calculated sensitivity.

An apparatus for setting a semiconductor parameter according to an embodiment of the present disclosure includes a preprocessing module configured to acquire electrical measurement parameters corresponding to preset semiconductor manufacturing parameters, classify the electrical measurement parameters into a plurality of groups according to a degree of correlation, and extract a correlation axis reflecting a correlation between electrical measurement parameters belonging to a corresponding group for each classified group, and a prediction module configured to predict a figure of merit of a semiconductor device by using data values of electrical measurement parameters belonging to the corresponding group as input based on the correlation axis of each group.

The preprocessing module may be configured to calculate variance inflation factors between the electrical measurement parameters, respectively, and classify electrical measurement parameters of which the calculated variance inflation factor is equal to or greater than a preset threshold value into the same group.

The preprocessing module may be configured to generate an artificial neural network model for each group when grouping of the electrical measurement parameters is completed, and extract a correlation axis between the electrical measurement parameters belonging to each group by training each of the generated artificial neural network models.

The number of the correlation axes to be extracted may be set to be the same as the number of electrical measurement parameters belonging to the corresponding group.

The preprocessing module may be configured to check whether or not there are data that are not missing at the same time in two electrical measurement parameters when a missing value is included in the acquired electrical measurement parameter, and calculate a variance inflation factor of the two electrical measurement parameters by using the data that are not missing at the same time when there are the data that are not missing at the same time.

The preprocessing module may be configured to train the artificial neural network model by setting a partial loss error to zero for the missing value data when the artificial neural network model is trained, and predict a missing value of a corresponding electrical measurement parameter by inputting the extracted correlation axis into the artificial neural network model when training of the artificial neural network model is completed.

The preprocessing module may be configured to set an effective correlation axis among the correlation axes extracted for each group, and the prediction module may be configured to predict the figure of merit of the semiconductor device by using data values of electrical measurement parameters belonging to the corresponding group as input based on the effective correlation axis set in each group.

The preprocessing module may be configured to calculate explained variances (EVs) for the correlation axes extracted for each group, respectively, and set, among the correlation axes, a correlation axis in which a value of the calculated explained variance is equal to or greater than a preset threshold value as the effective correlation axis.

The prediction module may be configured to limit a data range of the electrical measurement parameters in each classified group within a data distribution range based on the extracted correlation axis with the extracted correlation axis as a reference.

The apparatus for setting the semiconductor parameter may further include an analysis module configured to calculate sensitivity to the figure of merit of the electrical measurement parameters within the data distribution range with the correlation axis as a reference, and select an electrical measurement parameter capable of optimizing the corresponding figure of merit based on the calculated sensitivity.

According to the disclosed embodiment, even if there is a missing value in the electrical measurement parameter, the electrical measurement parameters are classified and grouped according to the correlation, a partial loss error is set to zero for missing data to train an inverse NLPCA model when training the inverse NLPCA model, the coordinates of the correlation axis between the electrical measurement parameters are input to the inverse NLPCA model in a state in which the inverse NLPCA model is trained, thereby capable of predicting a missing data value of a corresponding electrical measurement parameter. As a result, it becomes possible to solve the problem of an incomplete data set according to the missing value.

In addition, the correlation axis between the electrical measurement parameters for each group is extracted and the figure of merit of the semiconductor device is predicted based on the extracted correlation axis, thereby capable of performing independent analysis on the electrical measurement parameters that are correlated with each other while using the electrical measurement parameters reflecting information of the process steps.

In addition, the figure of merit of the semiconductor device is predicted by using data values of electrical measurement parameters including process variability and random variability obtained by being undergone the process steps rather than the semiconductor manufacturing parameters as input values, thereby capable of extracting the data values of the electrical measurement parameters that can optimize the figure of merit of the semiconductor device without changing the process recipe.

DETAILED DESCRIPTION

Hereinafter, a specific embodiment of the present disclosure will be described with reference to the drawings. The following detailed description is provided to aid in a comprehensive understanding of the methods, apparatus and/or systems described herein. However, this is illustrative only, and the present disclosure is not limited thereto.

In describing the embodiments of the present disclosure, when it is determined that a detailed description of related known technologies may unnecessarily obscure the subject matter of the present disclosure, a detailed description thereof will be omitted. In addition, terms to be described later are terms defined in consideration of functions in the present disclosure, which may vary according to the intention or custom of users or operators. Therefore, the definition should be made based on the contents throughout this specification. The terms used in the detailed description are only for describing embodiments of the present disclosure, and should not be limiting. Unless explicitly used otherwise, expressions in the singular form include the meaning of the plural form. In this description, expressions such as "comprising" or "including" are intended to refer to certain features, numbers, steps, actions, elements, some or combination thereof, and it is not to be construed to exclude the presence or possibility of one or more other features, numbers, steps, actions, elements, some or combinations thereof, other than those described.

In addition, terms such as first and second may be used to describe various components, but the components should not be limited by the terms. The above terms may be used for the purpose of distinguishing one component from another component. For example, without departing from the scope of the present invention, a first component may be referred to as a second component, and similarly, the second component may also be referred to as the first component.

Figure 1:
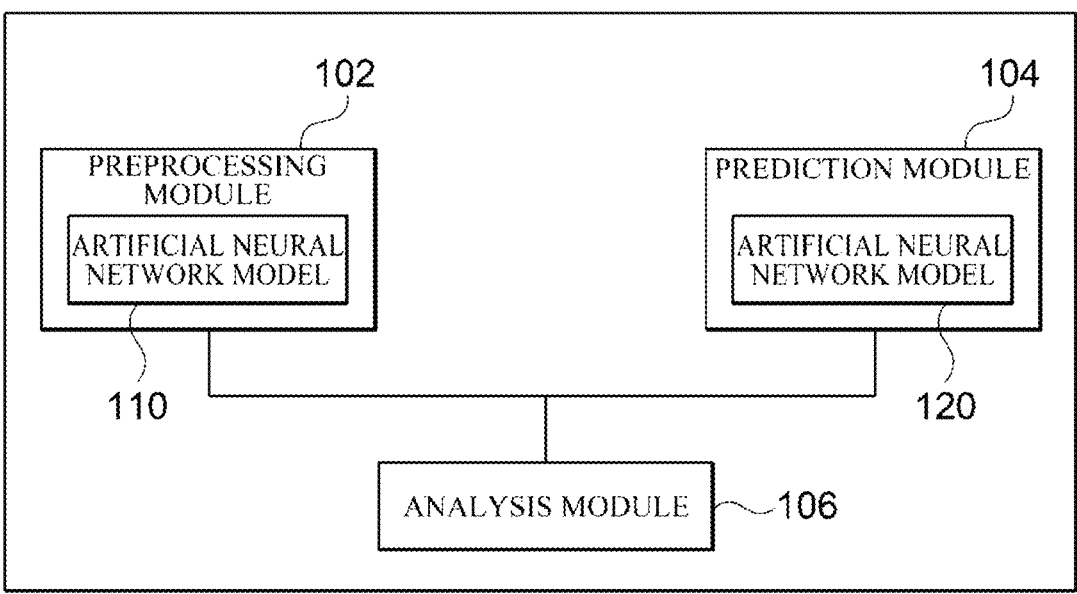
FIG. 1 is a diagram illustrating an apparatus for setting a semiconductor parameter according to an embodiment of the present disclosure.

FIG. 1 is a diagram illustrating an apparatus for setting a semiconductor parameter according to an embodiment of the present disclosure.

Referring to FIG. 1, an apparatus for setting the semiconductor parameter 100 may include a preprocessing module 102, a prediction module 104, and an analysis module 106.

The preprocessing module 102 may acquire electrical measurement parameters corresponding to each of semiconductor manufacturing parameters. Here, the semiconductor manufacturing parameter is a design parameter used to manufacture a semiconductor of a specific structure. For example, when the semiconductor is a transistor, the semiconductor manufacturing parameters may include gate length, oxide thickness, doping concentration, junction gradient, gate stack height, etc.

The electrical parameter measurement (EPM) is a measured parameter value capable of estimating a semiconductor manufacturing parameter after a semiconductor manufacturing process is performed using the semiconductor manufacturing parameter as a target value. For example, the electrical measurement parameter corresponding to the gate length may be an electrical critical dimension (ECD), and the electrical measurement parameter corresponding to an insulating film thickness may be an effective oxide thickness (EOT) and a breakdown voltage (BV).

The preprocessing module 102 may group the acquired electrical measurement parameters (EPMs) according to the degree of correlation. That is, the preprocessing module 102 may classify the electrical measurement parameters into a plurality of groups according to the degree of mutual correlation of the electrical measurement parameters.

That is, it is said that, if a value of one variable can be determined by a value of another variable, a correlation exists between the variables. The electrical measurement parameters may have such a correlation. For example, among the electrical measurement parameters, the effective oxide thickness (EOT) and the breakdown voltage (BV) have a positive correlation. That is, the thicker the effective oxide thickness, the higher the breakdown voltage. The electrical critical length (ECD) and effective oxide thickness (EOT) of an NMOS and the electrical critical length (ECD) and the effective oxide thickness (EOT) of a PMOS have a positive correlation. In addition, among the electrical measurement parameters, poly depletion ratio and inversion capacitance have a positive correlation.

On the other hand, a drain saturation current $I_{dsat}$ and a threshold voltage $V_{th}$ have a negative correlation. In addition, the drain-off current $I_{dsat}$ and the threshold voltage $V_{th}$ also have a negative correlation.

In addition, the electrical measurement parameters may have a nonlinear correlation in addition to the linear correlations such as the positive correlation and negative correlation. For example, the drain saturation current $I_{dsat}$, drain-off current $I_{doff}$ and poly depletion ratio (PDR) have a nonlinear correlation. On the other hand, there are various electrical measurement parameters having a statistical correlation.

In an exemplary embodiment, the preprocessing module 102 may group the electrical measurement parameters based on a variance inflation factor (VIF).

The preprocessing module 102 may calculate the variance inflation factors between the acquired electrical measurement parameters, respectively. The preprocessing module 102 may classify the electrical measurement parameters of which variance inflation factor value is equal to or greater than a preset threshold value into the same group. Here, the variance inflation factor is an index that describes how well a variable can be determined by another variable. For example, the preprocessing module 102 may classify electrical measurement parameters having a variance inflation factor (VIF) value of 6 or more into the same group, but the threshold value is not limited thereto.

The preprocessing module 102 may calculate a variance inflation factor $VIF_1$ between an i-th electrical measurement parameter and other electrical measurement parameters in the corresponding group through Equation 1 below.

$$VIF_i = \frac{1}{1 - R_i^2}$$   Equation 1 where, $R_i^2$:

coefficient of determination (regression coefficient) between the i-th electrical measurement parameter and other electrical measurement parameters in the corresponding group The preprocessing module 102 may convert a domain representing data distribution of electrical measurement parameters belonging to a corresponding group for each group classified according to the degree of correlation between the electrical measurement parameters into a domain for well explaining the correlation between the electrical measurement parameters belonging to the corresponding group.

That is, the preprocessing module 102 may perform data distribution domain transformation of electrical measurement parameters by changing the existing reference axis representing the data distribution of the electrical measurement parameters belonging to the corresponding group to an axis containing the correlation between the electrical measurement parameters (axis reflecting the correlation between the electrical measurement parameters).

Here, the axis reflecting the correlation between the electrical measurement parameters may be a data analysis unit (e.g., a principal component) derived from a data analysis model such as principal component analysis (PCA), nonlinear PCA (NLPCA), independent component analysis (ICA), and self-organizing map (SOM).

Figure 2:
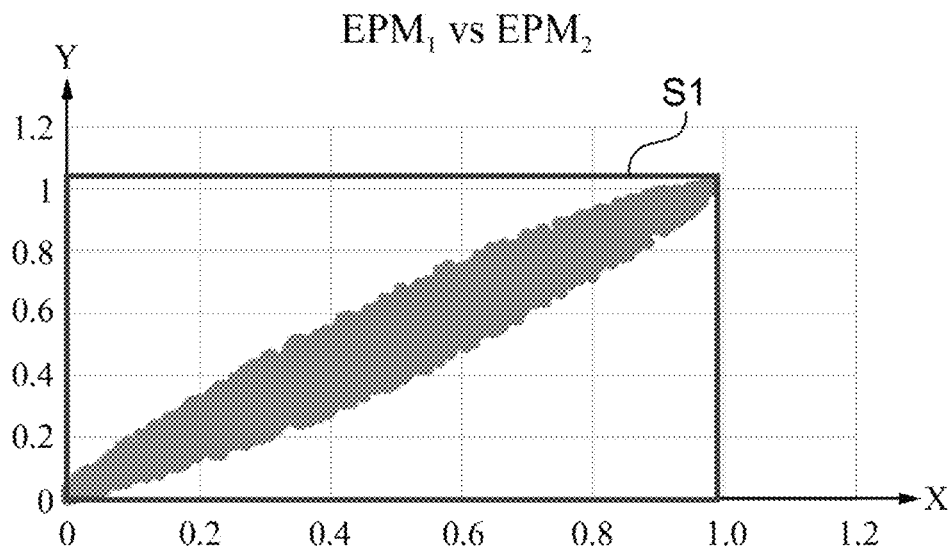
FIG. 2 is a graph illustrating data distribution of two electrical measurement parameters $EPM_1$ and $EPM_2$ belonging to one group in an embodiment of the present disclosure.
Figure 2:
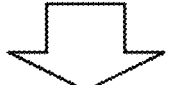

FIG. 2 is a graph illustrating data distribution of two electrical measurement parameters $EPM_1$ and $EPM_2$ belonging to one group in an embodiment of the present disclosure. Here, the X-axis is a reference axis indicating the magnitude of the first electrical measurement parameter $EPM_1$ (e.g., drain linear current $I_{d,lin}$), and the Y-axis is a reference axis indicating the magnitude of the second electrical measurement parameter $EPM_2$ (e.g., drain saturation current $I_{d,sat}$).

Referring to FIG. 2, it can be seen that the first electrical measurement parameter $EPM_1$ and the second electrical measurement parameter $EPM_2$ have a positive correlation. Accordingly, if the first electrical measurement parameter $EPM_1$ is changed along the X-axis, which is a general reference axis representing the data distribution, the second electrical measurement parameter $EPM_2$ also changes along the Y-axis, which is the reference axis, and vice versa. Accordingly, it is impossible to independently analyze the first electrical measurement parameter $EPM_1$ and the second electrical measurement parameter $EPM_2$, respectively.

In addition, it can be seen that a data distribution range S1 of the first electrical measurement parameter $EPM_1$ and the second electrical measurement parameter $EPM_2$ by the X and Y-axes, which are general reference axes representing the data distribution, does not properly express a region in which actual data are distributed. That is, the data distribution range S1 does not effectively represent the data distribution because an area of a region where the actual data is not distributed is larger than an area of the region where the actual data is distributed.

Accordingly, in the disclosed embodiment, the reference axes representing the data distribution of the first electrical measurement parameter $EPM_1$ and the second electrical measurement parameter $EPM_2$ may be changed to axes (A-axis and B-axis) of a new coordinate system that reflects the correlation between the first electrical measurement parameter $EPM_1$ and the second electrical measurement parameter $EPM_2$.

Here, if the reference axes representing the data distribution are changed from the existing X-axis and Y-axis to the A-axis and B-axis, the first electrical measurement parameter $EPM_1$ and the second electrical measurement parameter $EPM_2$ can be independently analyzed. In addition, a data distribution range S2 by the changed reference axes A-axis and B-axis can properly express the region in which actual data are distributed.

The preprocessing module 102 may extract an axis (hereinafter, may be referred to as a "correlation axis") reflecting the correlation between electrical measurement parameters belonging to a corresponding group through an artificial neural network by machine learning. In an exemplary embodiment, the preprocessing module 102 may extract correlation axes between the electrical measurement parameters belonging to a corresponding group using an inverse nonlinear principal component analysis (NLPCA) model.

These correlation axes may be data analysis units (e.g. principal component) derived from data analysis models such as principal component analysis (PCA), nonlinear PCA (NLPCA), independent component analysis (ICA), and self-organizing map (SOM).

For example, in the case of principal component analysis (PCA), a vector that minimizes an average of the squares of the distances from a vector consisting of n EPMs to each data in a data space (e.g., a data set consisting of n EPMs) of the electrical measurement parameters (EPMs) (i.e., electrical measurement parameters for which statistical correlation exists) of which variance inflation factor is equal to or greater than a preset threshold is the first can be a first major correlation axis. Among vectors perpendicular to the first main correlation axis, a vector that can greatly express the variance of the data set next may be the next main correlation axis.

As another example, in the case of nonlinear PCA (NLPCA), a curve that minimizes the average of the squares of the vertical distances from a nonlinear curve composed of n EPMs to each data may be the first major correlation axis. Among the curves perpendicular to the first major correlation axis, a curve that can greatly express the variance of the data set next may be the next major correlation axis.

Figure 3:
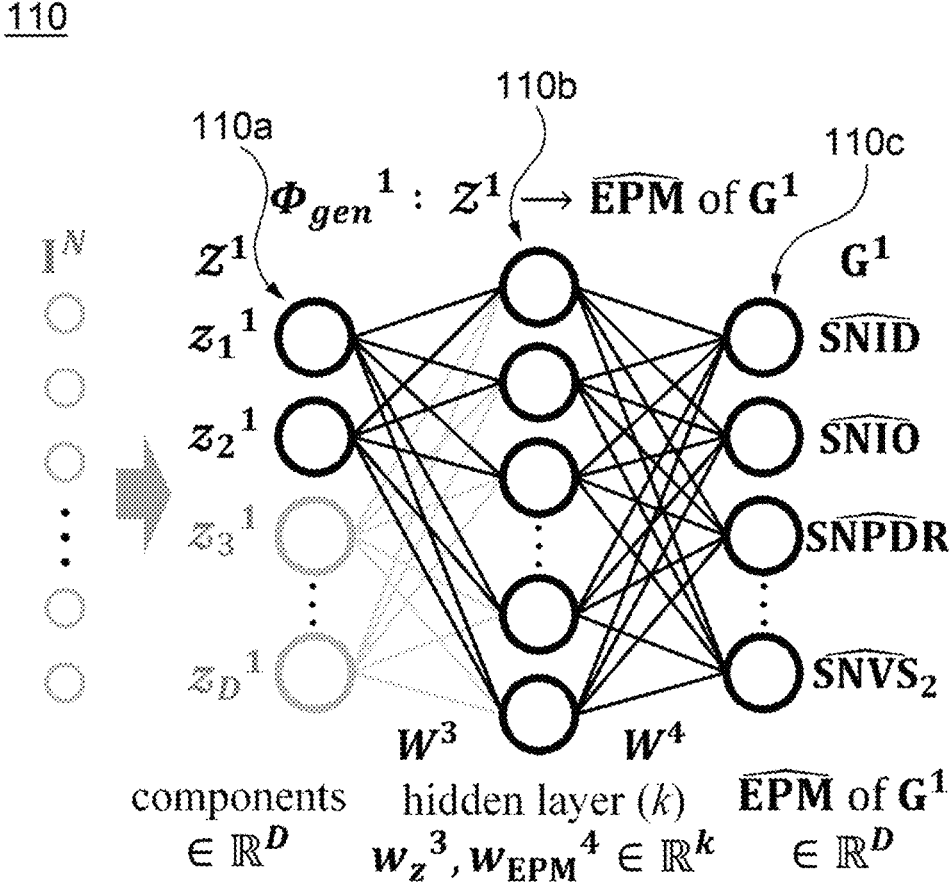
FIG. 3 is a diagram illustrating a state in which correlation axes between electrical measurement parameters belonging to a corresponding group are extracted using an inverse NLPCA model in an embodiment of the present disclosure.

FIG. 3 is a diagram illustrating a state in which correlation axes between electrical measurement parameters belonging to a corresponding group are extracted using an inverse NLPCA model in an embodiment of the present disclosure.

Referring to FIG. 3, an inverse NLPCA model 110 may include an input layer 110a, a hidden layer 110b, and an output layer 110c. Here, when the electrical measurement parameters SNID, SNIO, SNPDR, . . . , $SNVS_2$ belonging to group 1 (G1) are placed in the output layer 110c, the inverse NLPCA model 110 extracts the coordinates $z_1^1$, $z_2^1$, $z_3^1$, . . . , $z_D^1$ (where D may be the number of electrical measurement parameters belonging to group 1 (G1)) of the correlation axes between electrical measurement parameters SNID, SNIO, SNPDR, . . . , SNVS$_2$ belonging to the group
1 (G1) in the input layer 110$a$ through the hidden layer 110$b$.
Here, the coordinates $z_1^{\,1}, z_2^{\,1}, z_3^{\,1}, \ldots, z_D^{\,1}$ of the correlation
axes may be expressed as a vector according to the axis
direction. Since the inverse NLPCA model is a known
artificial neural network model, a detailed description
thereof will be omitted.

The preprocessing module 102 may generate the inverse
NLPCA model 110 for each group when grouping of the
electrical measurement parameters is completed and extract
a correlation axis between the electrical measurement
parameters belonging to each group by training each inverse
NLPCA model 110.

Meanwhile, the use of the inverse NLPCA model has been
described as an example here, but is not limited thereto, and
the correlation axis between electrical measurement param-
eters belonging to each group may be extracted using a
self-organizing map (SOM) model, an independent compo-
nent analysis (ICA) model, etc.

The preprocessing module 102 may calculate the
explained variances (EVs) for the correlation axis between
the electrical measurement parameters extracted for each
group, respectively. Here, the explained variance (EV) rep-
resents a proportion of how much the variance of each
extracted correlation axis occupies for the total variance of
the electrical measurement parameters. For example, when
the overall variance of data source is var (X), and the
variance of the i-th correlation axis extracted from the data
is var (Xi), the explained variance EVi of the i-th correlation
axis can be expressed by the following equation 2.

$$EV_i = \frac{\mathrm{var}(X_i)}{\mathrm{var}(X)} \qquad \text{Equation 2}$$

The preprocessing module 102 may set a correlation axis
in which the value of explained variance is greater than or
equal to a preset threshold value among the correlation axes
extracted for each group as an effective correlation axis.
That is, the preprocessing module 102 may exclude a
correlation axis, in which the explained variance value is
less than a preset threshold value, when the correlation axis
is present in the correlation axes extracted for each group,
and set only the correlation axis in which the explained
variance value is greater than or equal to the preset threshold
value as the effective correlation axis.

Figure 4:
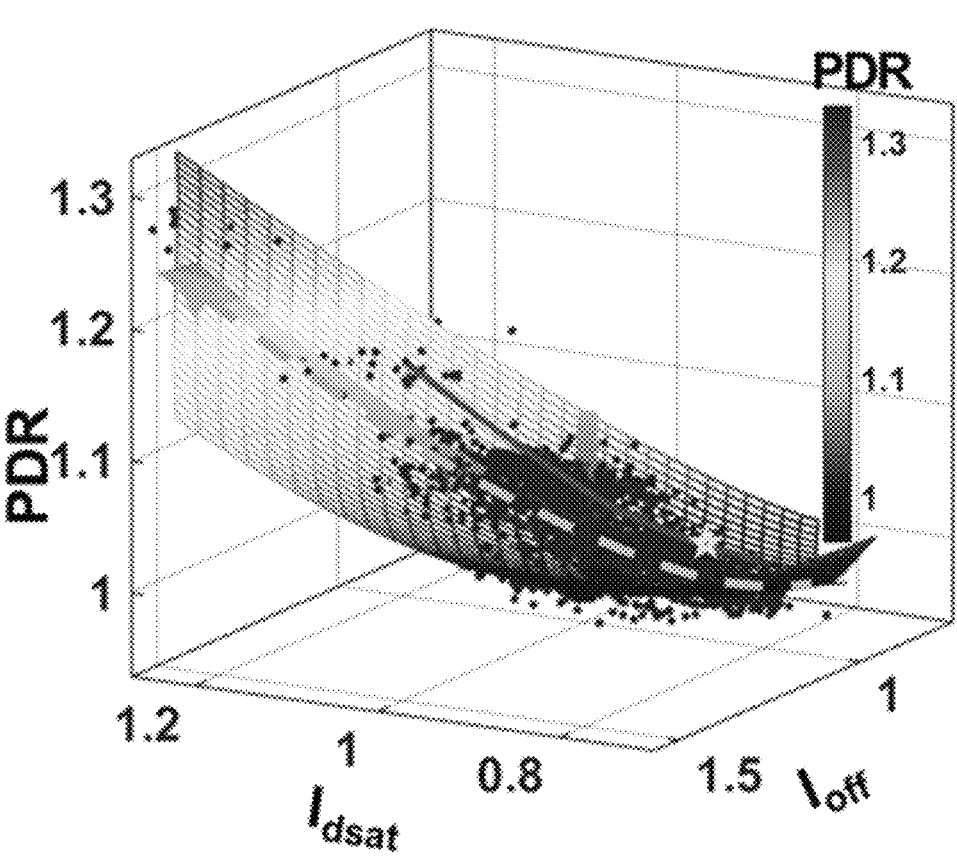
FIG. 4 is a graph illustrating a nonlinear correlation between a drain saturation current and drain-off current and poly depletion ratio (PDR) in a disclosed embodiment.

FIG. 4 is a graph illustrating a nonlinear correlation
between a drain saturation current I$_{dsat}$ and drain-off current
I$_{doff}$ and poly depletion ratio (PDR) in the disclosed embodi-
ment. Here, data distributions of three electrical measure-
ment parameters I$_{dsat}$, I$_{doff}$, and PDR are shown in three
dimensions.

Figure 5:
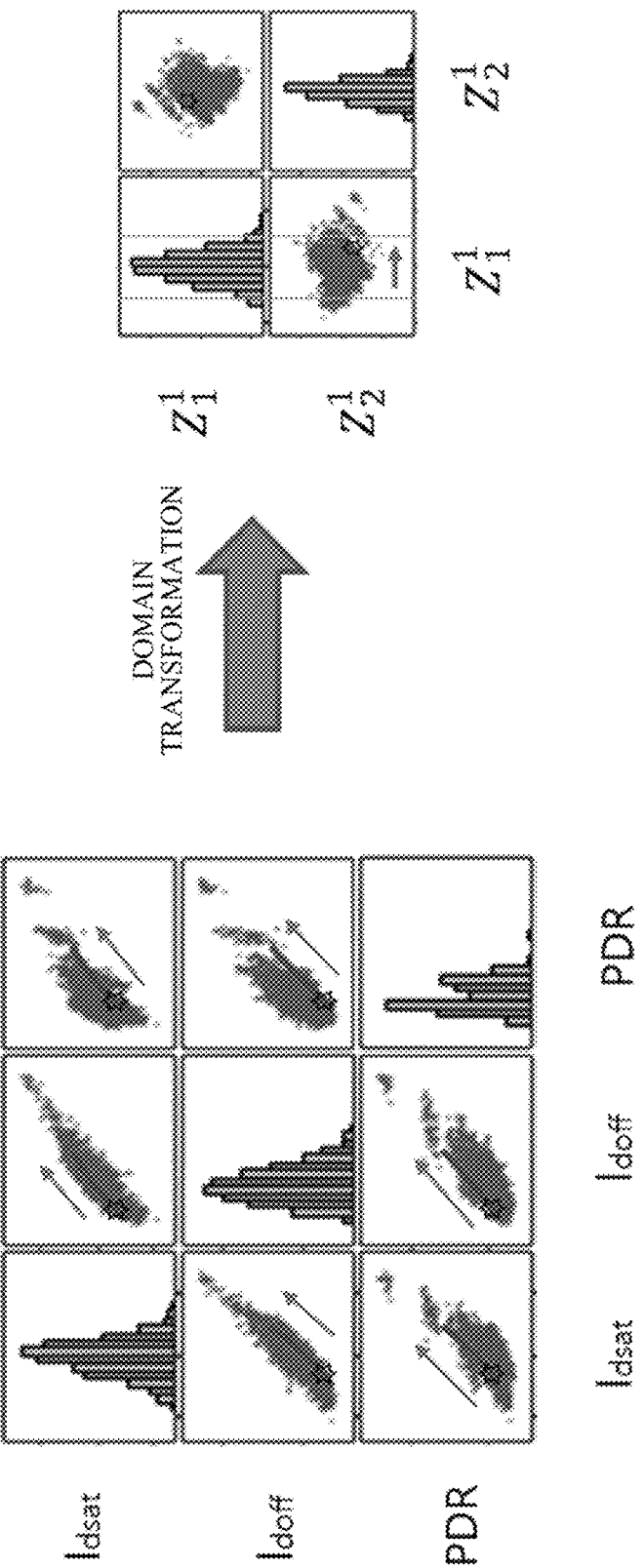
FIG. 5 is a diagram illustrating a two-dimensional representation of a correlation between the drain saturation current, drain-off current, and poly depletion ratio (PDR) having the data distribution of FIG. 4 and a state in which the correlation is converted into a domain of correlation axes.

FIG. 5 is a diagram illustrating a two-dimensional repre-
sentation of a correlation between the drain saturation cur-
rent I$_{dsat}$, drain-off current I$_{doff}$, and poly depletion ratio
(PDR) having the data distribution of FIG. 4 and the
two-dimensional representation of the correlation is con-
verted into a domain of correlation axes z$_1^{\,1}$ and z$_2^{\,1}$. That is,
FIG. 5 is a diagram in which the axes reflecting the corre-
lation between the three electrical measurement parameters
I$_{dsat}$, I$_{doff}$, and PDR are set as new axes of the coordinate
system.

Meanwhile, if missing values are included in the acquired
electrical measurement parameters (EPMs), since the order
of missing data may be different for each electrical mea-
surement parameter, the preprocessing module 102 may calculate the variance inflation factor between electrical
measurement parameters using data that are not missing at
the same time in two electrical measurement parameters.

For example, when calculating the variance inflation
factor between the first electrical measurement parameter
EPM$_1$ and the second electrical measurement parameter
EPM$_2$, if the first, third, and fifth data are missing in the first
electrical measurement parameter EPM$_1$, and the first and
fifth data are missing in the second electrical measurement
parameter EPM$_2$, the preprocessing module 102 may calcu-
late the variance inflation factor by using the second and
fourth data not missing at the same in the two electrical
measurement parameters.

In this case, if there is no data that is not missing at the
same time in the two electrical measurement parameters, the
preprocessing module 102 may calculate the variance infla-
tion factor with other electrical measurement parameters in
the corresponding group. For example, when calculating the
variance inflation factor between EPM$_1$ and EPM$_2$ that is not
yet grouped in a state in which the first electrical measure-
ment parameter EPM$_1$ belongs to the first group G1, if there
is no data that is not missing at the same time in the first
electrical measurement parameter EPM$_1$ and the second
electrical measurement parameter EPM$_2$, the preprocessing
module 102 may calculate the variance inflation factor
between another electrical measurement parameter in the
first group G1 to which the first electrical measurement
parameter EPM$_1$ belongs and the second electrical measure-
ment parameter EPM$_2$.

In addition, if missing values are included in the acquired
electrical measurement parameters (EPM), the preprocess-
ing module 102 may set the partial loss error to zero for
missing data and train the inverse NLPCA model 110 when
the correlation axes between the electrical measurement
parameters belonging to the group are extracted using the
inverse NLPCA model 110, thereby capable of prevent
missing data from affecting the training.

When the coordinates of the correlation axis between the
electrical measurement parameters extracted through the
inverse NLPCA model 110 are input to the input layer 110$a$
of the inverse NLPCA model in a state in which the training
of the inverse NLPCA model 110 is completed, a missing
data value of the corresponding electrical measurement
parameter is predicted in the output layer 110$c$. In this way,
even if a missing value is included in the electrical mea-
surement parameters, the missing value can be predicted and
filled.

The prediction model 104 may predict a figure of merit
(FOM) of a semiconductor device by using data values of
electrical measurement parameters belonging to a corre-
sponding group for each group grouped by the preprocessing
module 102 as input. Here, the figure of merit of the
semiconductor device may include power delay product
(PDP), frequency, ring oscillator delay (ROD), power dis-
sipation, IR drop, etc.

The prediction model 104 may include an artificial neural
network for predicting the figure of merit (FOM) of the
semiconductor device by using data values of electrical
measurement parameters belonging to each group as input.
Here, data values of electrical measurement parameters with
the effective correlation axis of the corresponding group
extracted by the preprocessing module 102 as a reference
may be used as input values of the artificial neural network.
That is, data values of electrical measurement parameters of
which domain is transformed (for which reference axis of
data distribution is transformed into effective correlation axis) through the preprocessing module 102 may be used as input values of the artificial neural network.

Figure 6:
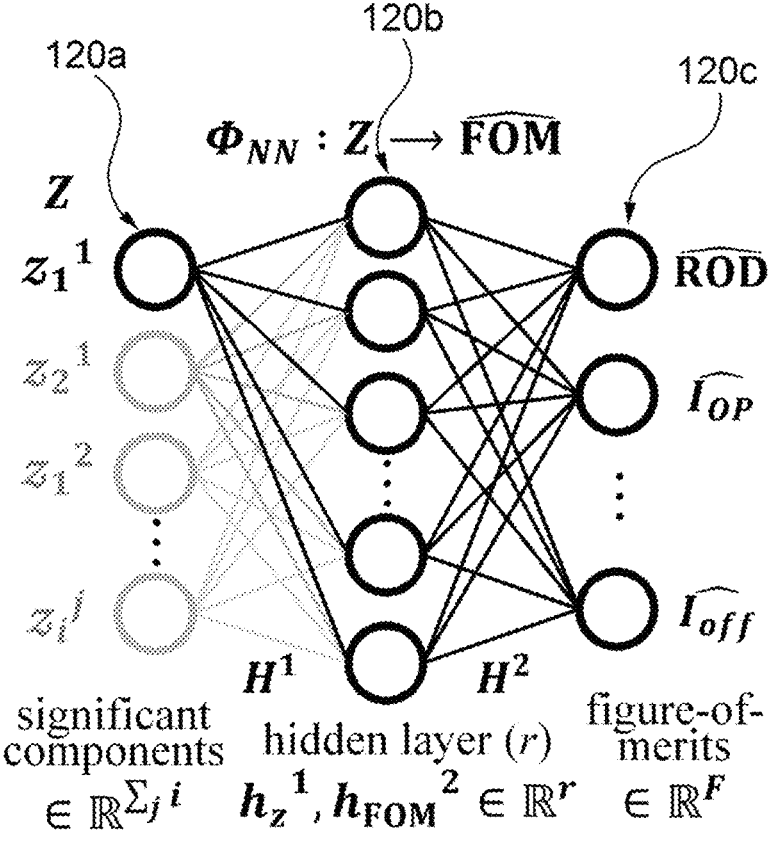
FIG. 6 is a diagram illustrating a state of predicting a figure of merit (FOM) of a semiconductor device using an artificial neural network model in an embodiment of the present disclosure.

FIG. 6 is a diagram illustrating a state of predicting the figure of merit (FOM) of a semiconductor device using an artificial neural network model in an embodiment of the present disclosure.

Referring to FIG. 6, an artificial neural network model 120 may include an input layer 120a, a hidden layer 120b, and an output layer 120c. Here, data values $z_1^1$, $z_2^1$, $z_1^2$, . . . , $z_1^j$ (i is the number of effective correlation axes within a group, j is the number of groups) of electrical measurement parameters may be input to the input layer 120a with an effective correlation axis of a corresponding group as a reference. Then, the artificial neural network model 120 may output the predicted value of the figure of merit (FOM) of the semiconductor device from the output layer 120c through the hidden layer 120b.

In this case, since the data values of the electrical measurement parameters are used as input with the effective correlation axis of the corresponding group as a reference, it is possible to output the predicted value of the figure of merit (FOM) of the semiconductor device while independently changing the electrical measurement parameters even within a group.

In addition, the prediction module 104 may set a data range of an electrical measurement parameter capable of optimizing the figure of merit (FOM) of the semiconductor device among the electrical measurement parameters in each group. Specifically, the prediction module 104 may set the data range of the electrical measurement parameter capable of optimizing the figure of merit (FOM) of the semiconductor device by setting a data range within a data distribution range with the effective correlation axis of each group as a reference. That is, referring to FIG. 2, the data range of the electrical measurement parameter capable of optimizing the figure of merit (FOM) of the semiconductor device is set by limiting the data range within the data distribution range S2 by the A-axis and the B-axis, which are the correlation axes of the first electrical measurement parameter EPM$_1$ and the second electrical measurement parameter EPM$_2$.

In an exemplary embodiment, the prediction module 104 may extract the data value of the electrical measurement parameter capable of optimizing the figure of merit (FOM) of the semiconductor device by applying a conjugate gradient method within a set data range.

The analysis module 106 may analyze how much each electrical measurement parameter in each group affects the figure of merit (FOM) of the semiconductor device. The analysis module 106 may calculate sensitivity of the corresponding figure of merit of the corresponding electrical measurement parameter through the difference between the figure of merit value when the minimum value within the set data range (i.e., the data range set with the effective correlation axis of the corresponding group as a reference) is input and the figure of merit value when the maximum value within the set data range is input for each electrical measurement parameter in the corresponding group. Here, the sensitivity may indicate how much the corresponding electrical measurement parameter affects the figure of merit.

For example, the analysis module 106 may calculate the PDP sensitivity of the corresponding electrical measurement parameter through the difference between a power delay product (PDP) value when the minimum value within the set range is input and the PDP value when the minimum value within the set range is input for a predetermined electrical measurement parameter. The analysis module 106 may calculate the PDP sensitivity for each electrical measurement parameter and select an electrical measurement parameter for obtaining an optimal PDP. For example, the analysis module 106 may select an electrical measurement parameter of which the calculated PDP sensitivity is greater than or equal to a preset standard as the electrical measurement parameter for obtaining then optimal PDP.

According to the disclosed embodiment, even if there is a missing value in the electrical measurement parameter, the electrical measurement parameters are classified and grouped according to the correlation, a partial loss error is set to zero for missing data to train an inverse NLPCA model when training the inverse NLPCA model, the coordinates of the correlation axis between the electrical measurement parameters are input to the inverse NLPCA model in a state in which the inverse NLPCA model is trained, thereby capable of predicting a missing data value of a corresponding electrical measurement parameter. As a result, it becomes possible to solve the problem of an incomplete data set according to the missing value.

In addition, the correlation axis between the electrical measurement parameters for each group is extracted and the figure of merit of the semiconductor device is predicted based on the extracted correlation axis, thereby capable of performing independent analysis on the electrical measurement parameters that are correlated with each other while using the electrical measurement parameters reflecting information of the process steps.

In addition, the figure of merit of the semiconductor device is predicted by using data values of electrical measurement parameters including process variability and random variability obtained by being undergone the process steps rather than the semiconductor manufacturing parameters as input values, thereby capable of extracting the data values of the electrical measurement parameters that can optimize the figure of merit of the semiconductor device without changing the process recipe.

In this specification, a module may mean a functional and structural combination of hardware for carrying out the technical idea of the present disclosure and software for driving the hardware. For example, the "module" may mean a predetermined code and a logical unit of a hardware resource for executing the predetermined code, and does not necessarily mean physically connected code or a single type of hardware.

Figure 7:
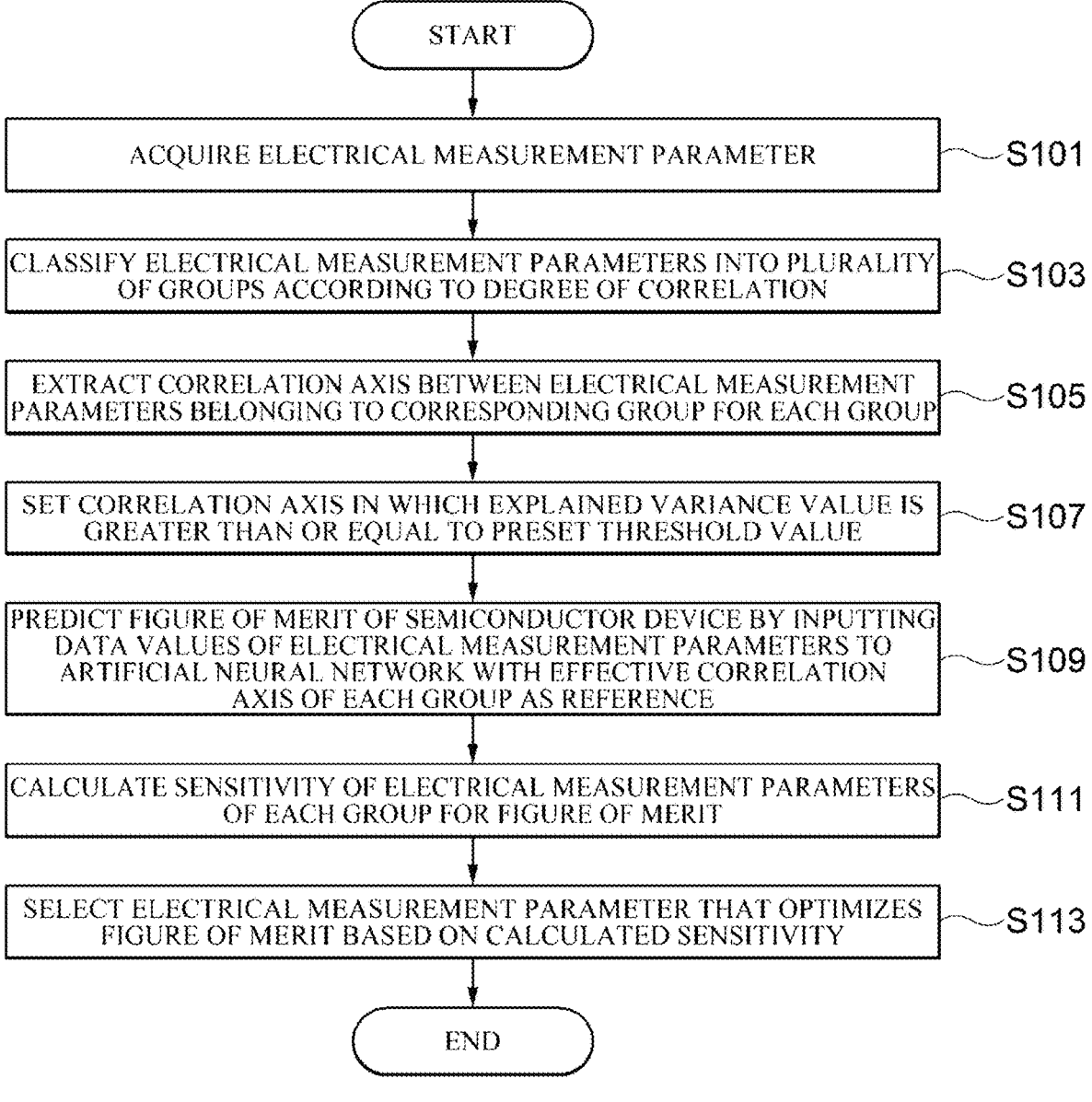
FIG. 7 is a flowchart illustrating a method for setting a semiconductor parameter according to an embodiment of the present disclosure.

FIG. 7 is a flowchart illustrating a method for setting a semiconductor parameter according to an embodiment of the present disclosure. In the illustrated flowchart, the method is described by dividing the method into a plurality of steps, but at least some of the steps may be performed in a different order, may be performed in combination with other steps, may be omitted, may be performed by being divided into sub-steps, or may be performed by being added with one or more steps (not illustrated).

Referring to FIG. 7, the apparatus for setting the semiconductor parameter 100 may acquire electrical measurement parameters corresponding to preset semiconductor manufacturing parameters (S101).

Next, the apparatus for setting the semiconductor parameter 100 may classify the acquired electrical measurement parameters into a plurality of groups according to the degree of correlation (S103). The apparatus for setting the semiconductor parameter 100 may calculate variance inflation factors between the acquired electrical measurement parameters, respectively, and classify the electrical measurement parameters into a plurality of groups based on the calculated variance inflation factor.

Next, the apparatus for setting the semiconductor parameter 100 may extract a correlation axis between the electrical measurement parameters belonging to a corresponding group for each group (S105). In an exemplary embodiment, the apparatus for setting the semiconductor parameter 100 may extract the correlation axes between the electrical measurement parameters belonging to the corresponding group using an inverse NLPCA model.

Next, the apparatus for setting the semiconductor parameter 100 may set a correlation axis in which the explained variance value is greater than or equal to a preset threshold value among the correlation axes extracted for each group as an effective correlation axis (S107).

Next, the apparatus for setting the semiconductor parameter 100 may predict the figure of merit (FOM) of the semiconductor device by using data values of electrical measurement parameters belonging to the corresponding group as input based on the effective correlation axis set in each group (S109). In this case, the apparatus for setting the semiconductor parameter 100 may predict the figure of merit (FOM) of the semiconductor device by using the data values of the electrical measurement parameters as input values of the artificial neural network with the effective correlation axis of the corresponding group as a reference.

Next, the apparatus for setting the semiconductor parameter 100 may calculate the sensitivity of the electrical measurement parameters of each group for the figure of merit of the semiconductor device (S111). The apparatus for setting the semiconductor parameter 100 may calculate the sensitivity of the electrical measurement parameters for the figure of merit of the semiconductor device by setting a data range within a data distribution range with the effective correlation axis of each group as a reference.

Next, the apparatus for setting the semiconductor parameter 100 may select the electrical measurement parameter capable of optimizing the figure of merit of the corresponding semiconductor device based on the calculated sensitivity (S113).

Figure 8:
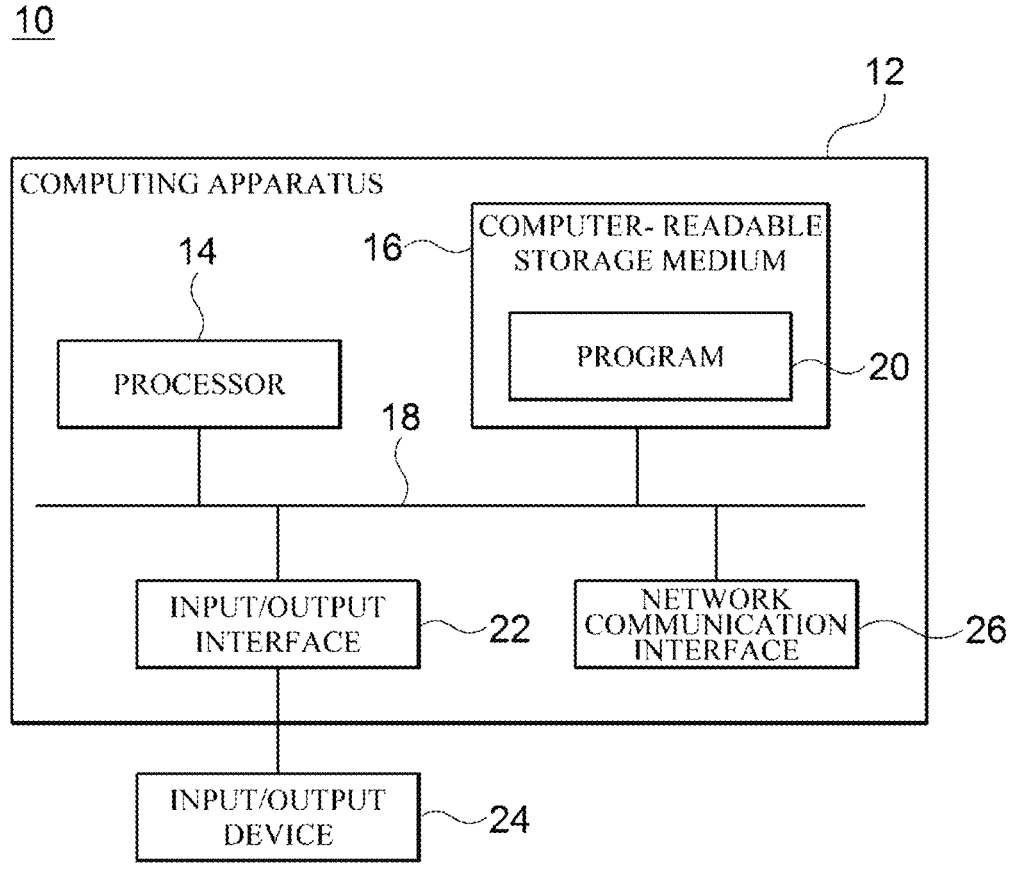
FIG. 8 is a block diagram illustratively describing a computing environment including a computing apparatus suitable for use in exemplary embodiments.

FIG. 8 is a block diagram illustratively describing a computing environment 10 including a computing apparatus suitable for use in exemplary embodiments. In the illustrated embodiment, respective components may have different functions and capabilities other than those described below, and may include additional components in addition to those described below.

The illustrated computing environment 10 includes the computing apparatus 12. In an embodiment, the computing apparatus 12 may be the apparatus for setting the semiconductor parameter 100.

The computing apparatus 12 includes at least one processor 14, a computer-readable storage medium 16, and a communication bus 18. The processor 14 may cause the computing apparatus 12 to operate according to the exemplary embodiment described above. For example, the processor 14 may execute one or more programs stored on the computer-readable storage medium 16. The one or more programs may include one or more computer-executable instructions, which, when executed by the processor 14, may be configured so that the computing apparatus 12 performs operations according to the exemplary embodiment.

The computer-readable storage medium 16 is configured so that the computer-executable instruction or program code, program data, and/or other suitable forms of information are stored. A program 20 stored in the computer-readable storage medium 16 includes a set of instructions executable by the processor 14. In one embodiment, the computer-readable storage medium 16 may be a memory (volatile memory such as a random access memory, non-volatile memory, or any suitable combination thereof), one or more magnetic disk storage devices, optical disk storage devices, flash memory devices, other types of storage media that are accessible by the computing apparatus 12 and capable of storing desired information, or any suitable combination thereof.

The communication bus 18 interconnects various other components of the computing apparatus 12, including the processor 14 and the computer-readable storage medium 16.

The computing apparatus 12 may also include one or more input/output interfaces 22 that provide an interface for one or more input/output devices 24, and one or more network communication interfaces 26. The input/output interface 22 and the network communication interface 26 are connected to the communication bus 18. The input/output device 24 may be connected to other components of the computing apparatus 12 through the input/output interface 22. The exemplary input/output device 24 may include a pointing device (such as a mouse or trackpad), a keyboard, a touch input device (such as a touch pad or touch screen), a speech or sound input device, input devices such as various types of sensor devices and/or photographing devices, and/or output devices such as a display device, a printer, a speaker, and/or a network card. The exemplary input/output device 24 may be included inside the computing apparatus 12 as a component constituting the computing apparatus 12, or may be connected to the computing apparatus 12 as a separate device distinct from the computing apparatus 12.

Although representative embodiments of the present disclosure have been described in detail, a person skilled in the art to which the present disclosure pertains will understand that various modifications may be made thereto within the limits that do not depart from the scope of the present disclosure. Therefore, the scope of rights of the present disclosure should not be limited to the described embodiments, but should be defined not only by claims set forth below but also by equivalents to the claims.

What is claimed is:

1. A method for setting a semiconductor parameter, the method being performed on a computing apparatus including one or more processors and a memory storing one or more programs executed by the one or more processors, the method comprising:

acquiring electrical measurement parameters corresponding to preset semiconductor manufacturing parameters;

classifying the electrical measurement parameters into a plurality of groups according to a degree of correlation;

extracting a correlation axis reflecting a correlation between electrical measurement parameters belonging to a corresponding group for each classified group; and predicting a figure of merit of a semiconductor device by using data values of electrical measurement parameters belonging to the corresponding group as input based on the correlation axis of each group, wherein the classifying of the electrical measurement parameters into the plurality of groups includes calculating variance inflation factors between the electrical measurement parameters, respectively, and classifying electrical measurement parameters of which the calculated variance inflation factor is equal to or greater than a preset threshold value into the same group.

2. The method of claim 1, wherein
the extracting of the correlation axis includes
    generating an artificial neural network model for each
        group when grouping of the electrical measurement
        parameters is completed, and
    extracting a correlation axis between the electrical
        measurement parameters belonging to each group by
        training each of the generated artificial neural net-
        work models.
3. The method of claim 2, wherein
the number of the correlation axes to be extracted is set to
    be the same as the number of electrical measurement
    parameters belonging to the corresponding group.
4. The method of claim 2, wherein
the calculating of the variance inflation factor when a
    missing value is included in the acquired electrical
    measurement parameter includes
    checking whether or not there are data that are not
        missing at the same time in two electrical measure-
        ment parameters, and
    calculating a variance inflation factor of the two elec-
        trical measurement parameters by using the data that
        are not missing at the same time when there are the
        data that are not missing at the same time.
5. The method of claim 2, wherein
when missing data is included in the acquired electrical
    measurement parameter, the method further includes
    training the artificial neural network model by setting a
        partial loss error to zero for the missing data when
        the artificial neural network model is trained, and
    predicting a missing value of a corresponding electrical
        measurement parameter by inputting the extracted
        correlation axis into the artificial neural network
        model when training of the artificial neural network
        model is completed.
6. The method of claim 1, further comprising:
setting an effective correlation axis among the correlation
    axes extracted for each group, wherein
in the predicting of the figure of merit of the semicon-
    ductor device,
    the figure of merit of the semiconductor device is
        predicted by using data values of electrical measure-
        ment parameters belonging to the corresponding
        group as input based on the effective correlation axis
        set in each group.
7. The method of claim 6, wherein
the setting of the effective correlation axis includes
    calculating explained variances (EVs) for the correla-
        tion axes extracted for each group, respectively, and
    setting, among the correlation axes, a correlation axis in
        which a value of the calculated explained variance is
        equal to or greater than a preset threshold value as
        the effective correlation axis.
8. The method of claim 1, further comprising:
limiting a data range of the electrical measurement param-
    eters in each classified group within a data distribution
    range with the extracted correlation axis as a reference.
9. The method of claim 8, further comprising:
calculating sensitivity to the figure of merit of the elec-
    trical measurement parameters within the data distri-
    bution range with the correlation axis as a reference;
    and
selecting an electrical measurement parameter capable of
    optimizing the corresponding figure of merit based on
    the calculated sensitivity.

10. An apparatus for setting a semiconductor parameter,
comprising:
    a preprocessing module configured to acquire electrical
        measurement parameters corresponding to preset semi-
        conductor manufacturing parameters, classify the elec-
        trical measurement parameters into a plurality of
        groups according to a degree of correlation, and extract
        a correlation axis reflecting a correlation between elec-
        trical measurement parameters belonging to a corre-
        sponding group for each classified group; and
    a prediction module configured to predict a figure of merit
        of a semiconductor device by using data values of
        electrical measurement parameters belonging to the
        corresponding group as input based on the correlation
        axis of each group,
    wherein the preprocessing module is configured to
        calculate variance inflation factors between the electri-
            cal measurement parameters, respectively, and
        classify electrical measurement parameters of which
            the calculated variance inflation factor is equal to or
            greater than a preset threshold value into the same
            group.
11. The apparatus of claim 10, wherein
the preprocessing module is configured to
    generate an artificial neural network model for each
        group when grouping of the electrical measurement
        parameters is completed, and
    extract a correlation axis between the electrical mea-
        surement parameters belonging to each group by
        training each of the generated artificial neural net-
        work models.
12. The apparatus of claim 11, wherein
the number of the correlation axes to be extracted is set to
    be the same as the number of electrical measurement
    parameters belonging to the corresponding group.
13. The apparatus of claim 11, wherein
the preprocessing module is configured to
    check whether or not there are data that are not missing
        at the same time in two electrical measurement
        parameters when a missing value is included in the
        acquired electrical measurement parameter, and cal-
        culate a variance inflation factor of the two electrical
        measurement parameters by using the data that are
        not missing at the same time when there are the data
        that are not missing at the same time.
14. The apparatus of claim 11, wherein
the preprocessing module is configured to
    train the artificial neural network model by setting a
        partial loss error to zero for missing data when the
        artificial neural network model is trained, and predict
        a missing value of a corresponding electrical mea-
        surement parameter by inputting the extracted cor-
        relation axis into the artificial neural network model
        when training of the artificial neural network model
        is completed.
15. The apparatus of claim 10, wherein
the preprocessing module is configured to set an effective
    correlation axis among the correlation axes extracted
    for each group, and
the prediction module is configured to predict the figure of
    merit of the semiconductor device by using data values
    of electrical measurement parameters belonging to the
    corresponding group as input based on the effective
    correlation axis set in each group.
16. The apparatus of claim 15, wherein
the preprocessing module is configured to
    calculate explained variances (EVs) for the correlation
        axes extracted for each group, respectively, and set,
        among the correlation axes, a correlation axis in which a value of the calculated explained variance is equal to or greater than a preset threshold value as the effective correlation axis.

17. The apparatus of claim 10, wherein the prediction module is configured to limit a data range of the electrical measurement parameters in each classified group within a data distribution range with the extracted correlation axis as a reference.

18. The apparatus of claim 17, further comprising:

an analysis module configured to calculate sensitivity to the figure of merit of the electrical measurement parameters within the data distribution range with the correlation axis as a reference and select an electrical measurement parameter capable of optimizing the corresponding figure of merit based on the calculated sensitivity.

\*   \*   \*   \*   \*